(12) United States Patent
Kawamura et al.

(10) Patent No.: US 8,159,230 B2
(45) Date of Patent: Apr. 17, 2012

(54) INSULATION MEASUREMENT METHOD AND INSULATION MEASUREMENT APPARATUS

(75) Inventors: Yoshihiro Kawamura, Makimohara (JP); Mitsuteru Yano, Wako (JP); Toshihiro Sone, Wako (JP); Toshiaki Takeshita, Wako (JP)

(73) Assignees: Yazaki Corporation, Tokyo (JP); Honda Motor Co., Ltd., Tokyo (JP)

( * ) Notice: Subject to any disclaimer, the term of this patent is extended or adjusted under 35 U.S.C. 154(b) by 320 days.

(21) Appl. No.: 12/470,142

(22) Filed: May 21, 2009

(65) Prior Publication Data

US 2009/0289639 A1 Nov. 26, 2009

(30) Foreign Application Priority Data

May 26, 2008 (JP) ................................ P2008-137060

(51) Int. Cl.
*H01H 31/12* (2006.01)
(52) U.S. Cl. ........................................................ 324/551
(58) Field of Classification Search ........................ None
See application file for complete search history.

(56) References Cited

U.S. PATENT DOCUMENTS

| | | | | |
|---|---|---|---|---|
| 5,712,572 | A * | 1/1998 | Tamechika et al. | 324/551 |
| 6,362,627 | B1 * | 3/2002 | Shimamoto et al. | 324/434 |
| 2007/0210805 | A1 * | 9/2007 | Kawamura | 324/541 |
| 2009/0289640 | A1 * | 11/2009 | Kawamura et al. | 324/658 |
| 2011/0084705 | A1 * | 4/2011 | Kawamura | 324/551 |

FOREIGN PATENT DOCUMENTS

| | | |
|---|---|---|
| JP | 2004-170103 | 6/2004 |
| JP | 2006-177765 | 7/2006 |
| JP | 2007-240300 | 9/2007 |

OTHER PUBLICATIONS

Translation of JP 2004-170103 filed on Jun. 17, 2004.*
Translation of JP 2007-240300 filed on Sep. 20, 2007.*

* cited by examiner

*Primary Examiner* — Jermele M Hollington
(74) *Attorney, Agent, or Firm* — Morgan, Lewis & Bockius LLP

(57) ABSTRACT

An insulation measurement method in an insulation measurement apparatus of a flying capacitor type, includes a first power supply charge voltage measurement process of applying a voltage of a power supply to a flying capacitor for a first charge time period a first grounding resistor measuring voltage measurement process of applying the voltage of the power supply to the flying capacitor via an insulation resistor on one electrode side of the power supply, a second power supply charge voltage measurement process of applying the voltage of the power supply to the flying capacitor for a second charge time period, a second grounding resistor measuring voltage measurement process of applying the voltage of the power supply to the flying capacitor via an insulation resistor on the other electrode side of the power supply, and an insulation resistor conversion process of obtaining a value of the insulation resistor based on measurement results of the first and second charge voltage measurement processes and the first and second grounding resistor measuring voltage measurement processes and an insulation resistor conversion expression.

4 Claims, 5 Drawing Sheets

FIG. 2

| V0 MEASUREMENT MODE || | VC1n MEASUREMENT MODE ||| VC1p MEASUREMENT MODE ||| DETERMINATION MODE |
|---|---|---|---|---|---|---|---|---|
| V0 CHARGE | V0 MEASUREMENT | DIS-CHARGE | VC1n CHARGE | VC1n MEASUREMENT | DIS-CHARGE | VC1p CHARGE | VC1p MEASUREMENT | DIS-CHARGE | PROCESSING |

FIG. 6A

| V0 CHARGE | V0 MEASUREMENT | DIS-CHARGE | VC1n CHARGE | VC1n MEASUREMENT | DIS-CHARGE | V0 CHARGE | V0 MEASUREMENT | VC1p CHARGE | VC1p MEASUREMENT | DIS-CHARGE | PROCESSING |
|---|---|---|---|---|---|---|---|---|---|---|---|
| FIRST V0 MEASUREMENT MODE | | | VC1n MEASUREMENT MODE | | | SECOND V0 MEASUREMENT MODE | | VC1p MEASUREMENT MODE | | | DETERMINA-TION MODE |

CHARGE TIME PERIOD TC1

FIG. 6B

| V0 CHARGE | V0 MEASUREMENT | DIS-CHARGE | VC1n CHARGE | VC1n MEASUREMENT | DIS-CHARGE | V0 CHARGE | V0 MEASUREMENT | VC1p CHARGE | VC1p MEASUREMENT | DIS-CHARGE | PROCESSING |
|---|---|---|---|---|---|---|---|---|---|---|---|
| FIRST V0 MEASUREMENT MODE | | | VC1n MEASUREMENT MODE | | | SECOND V0 MEASUREMENT MODE | | VC1p MEASUREMENT MODE | | | DETERMINA-TION MODE |

CHARGE TIME PERIOD TC2

FIG. 6C

| V0 CHARGE | V0 MEASUREMENT | DIS-CHARGE | VC1n CHARGE | VC1n MEASUREMENT | DIS-CHARGE | V0 CHARGE | V0 MEASUREMENT | VC1p CHARGE | VC1p MEASUREMENT | DIS-CHARGE | PROCESSING |
|---|---|---|---|---|---|---|---|---|---|---|---|
| FIRST V0 MEASUREMENT MODE | | | VC1n MEASUREMENT MODE | | | SECOND V0 MEASUREMENT MODE | | VC1p MEASUREMENT MODE | | | DETERMINA-TION MODE |

CHARGE TIME PERIOD TC1

INSULATION MEASUREMENT METHOD AND INSULATION MEASUREMENT APPARATUS

BACKGROUND

The present invention relates to an insulation measurement method and an insulation measurement apparatus and, in particular, relates to the insulation measurement method and the insulation measurement apparatus which can detect the insulation state of a high-voltage power supply etc. accurately and reduce the influence of the voltage fluctuation of the high-voltage power supply by using the insulation measurement apparatus of a flying capacitor type.

Conventionally, a battery for charging electric power into and for supplying electric power to electrical equipments such as a light turning-on system and an air conditioner is mounted on an automobile. Automobiles of the day depend on electric power as is no exaggeration to say that the automobiles can not work without electric power.

That is, in the case where a suitable electric power supply can not be maintained, it becomes difficult to suitably control a vehicle. Further, there may arise a problem that an automobile stops if an alarm is issued or a driver overlooks this state. Thus, it has become more important to suitably monitor the power supply.

For example, as one of techniques for monitoring the power supply, there is a technique of determining the actual insulation state of the power supply placed in the insulation state. To be concrete, there is an insulation measurement circuit of a flying capacitor type (see JP-A-2004-170103).

Although the circuit configuration and the operation of the circuit in the technique disclosed in JP-A-2004-170103 will be explained in detail as a basic technique in an embodiment, the circuit configuration and the operation will be explained briefly. This circuit includes a capacitor in a state of being electrically floated from the grounding voltage, resistors and switching elements. As the capacitor, a ceramic capacitor capable of being miniaturized is used. The switching elements are suitably controlled so as to set the capacitor a charge power supply voltage ($V0$) corresponding to a charging time period of a voltage V of the power supply and the charge power supply voltage $V0$ is measured. Succeedingly, after the switching elements are suitably controlled to thereby discharge the voltage set to the capacitor, in order to measure a grounding resistor measurement voltage, the capacitor is charged by the power supply in a state that the one end terminal of the capacitor is coupled to a ground resistor and a voltage set to the capacitor at this time is measured (hereinafter called "a grounding resistor measurement voltage $VC1a$"). Then, after the grounding resistor measurement voltage $VC1a$ is discharged, the switching elements are suitably controlled to thereby charge the capacitor in a state that the other end terminal of the capacitor is grounded via a ground resistor and a voltage set to the capacitor at this time is measured (hereinafter called "a grounding resistor measurement voltage $VC1b$"). When the measurement is completed, the grounding resistor measurement voltage $VC1b$ is discharged. When these three kinds of voltages $V0$, $VC1a$ and $VC1b$ are measured, an insulation resistor conversion is performed based on these voltages in accordance with a calculation expression $(VC1a+VC1b)/V0$ and the insulation state is determined with reference to the conversion result and a predetermined table.

However, according to the technique disclosed in JP-A-2004-170103, the insulation state of the power supply is detected quickly and the variance of the characteristics of the capacitor is compensated to thereby realize a high detection accuracy. However, the aforesaid technique is realized based on that the voltage V of the power supply is constant. That is, there arises a case that the detection accuracy degrades when there is a difference of the charge voltage $V0$ of the power supply between the case of measuring the charge voltage $V0$ of the power supply set to the capacitor and the case of measuring the grounding resistor measurement voltages $VC1a$ and $VC1b$.

SUMMARY

The invention is made in view of the circumstance and an object of the invention is to provide a technique of reducing the influence of the fluctuation of the voltage of a power supply in an insulation measurement circuit of a flying capacitor type.

In order to achieve the above object, according to the present invention, there is provided an insulation measurement method in an insulation measurement apparatus of a flying capacitor type, comprising:

a first power supply charge voltage measurement step of applying a voltage of a power supply to a flying capacitor for a first charge time period;

a first grounding resistor measuring voltage measurement step of applying the voltage of the power supply to the flying capacitor via an insulation resistor on one electrode side of the power supply;

a second power supply charge voltage measurement step of applying the voltage of the power supply to the flying capacitor for a second charge time period;

a second grounding resistor measuring voltage measurement step of applying the voltage of the power supply to the flying capacitor via an insulation resistor on the other electrode side of the power supply; and an insulation resistor conversion step of obtaining a value of the insulation resistor based on measurement results of the first and second charge voltage measurement steps and the first and second grounding resistor measuring voltage measurement steps and an insulation resistor conversion expression.

Preferably, the charge time period of each of the first and second power supply charge voltage measurement steps and the first and second grounding resistor measuring voltage measurement steps is set to be a time period insufficient for fully charging the flying capacitor.

Preferably, wherein the charge time period of each of the first and second grounding resistor measuring voltage measurement steps is set to be a time period insufficient for fully charging the flying capacitor. Each of the first charge time period and the second charge time period is set to be a time period for fully charging the flying capacitor. The insulation measurement method is executed in a case where another predetermined device provided originally for measuring the voltage of the power supply does not operate normally. A measurement result of the voltage of the power supply in the first power supply charge voltage measurement step or the second power supply charge voltage measurement step is used in place of a measurement result of the another predetermined device.

Preferably, the first charge time period is set to be a time period for fully charging the flying capacitor. The second charge time period is set to be a time period insufficient for fully charging the flying capacitor. The insulation measurement method is executed in a case where another predetermined device provided originally for measuring the voltage of the power supply does not operate normally. A measurement result of the voltage of the power supply in the first power supply charge voltage measurement step is used in place of a measurement result of the another predetermined device. A measurement result of the voltage of the power supply in the second power supply charge voltage measurement step is used in the insulation resistor conversion step.

According to the present invention, there is also provided an insulation measurement apparatus for executing the above insulation measurement methods.

According to the invention, in the insulation measurement circuit of a flying capacitor type, a technique of reducing the influence of fluctuation of the voltage of a power supply can be provided

BRIEF DESCRIPTION OF THE DRAWINGS

The above objects and advantages of the present invention will become more apparent by describing in detail preferred exemplary embodiments thereof with reference to the accompanying drawings, wherein:

FIG. 2 is a diagram showing a schematic flow of the basic method of an insulation measurement method according to the basic technique of the embodiment;

FIGS. 6A to 6C are diagram showing schematic flows of first to third measurement methods obtained by improving the basic method shown in FIG. 2 according to the embodiment.

DETAILED DESCRIPTION OF EXEMPLARY EMBODIMENTS

Hereinafter, the preferable embodiment for implementing the invention will be explained with reference to drawings. This embodiment is realized by using the insulation measurement circuit of the related art as a basic technique and proposes a new measurement method in the insulation measurement circuit. Thus, firstly, the circuit configuration and the operation of the insulation measurement circuit will be explained as the basic technique and then first to third measurement methods proposed in this embodiment will be explained.

Figure 1:
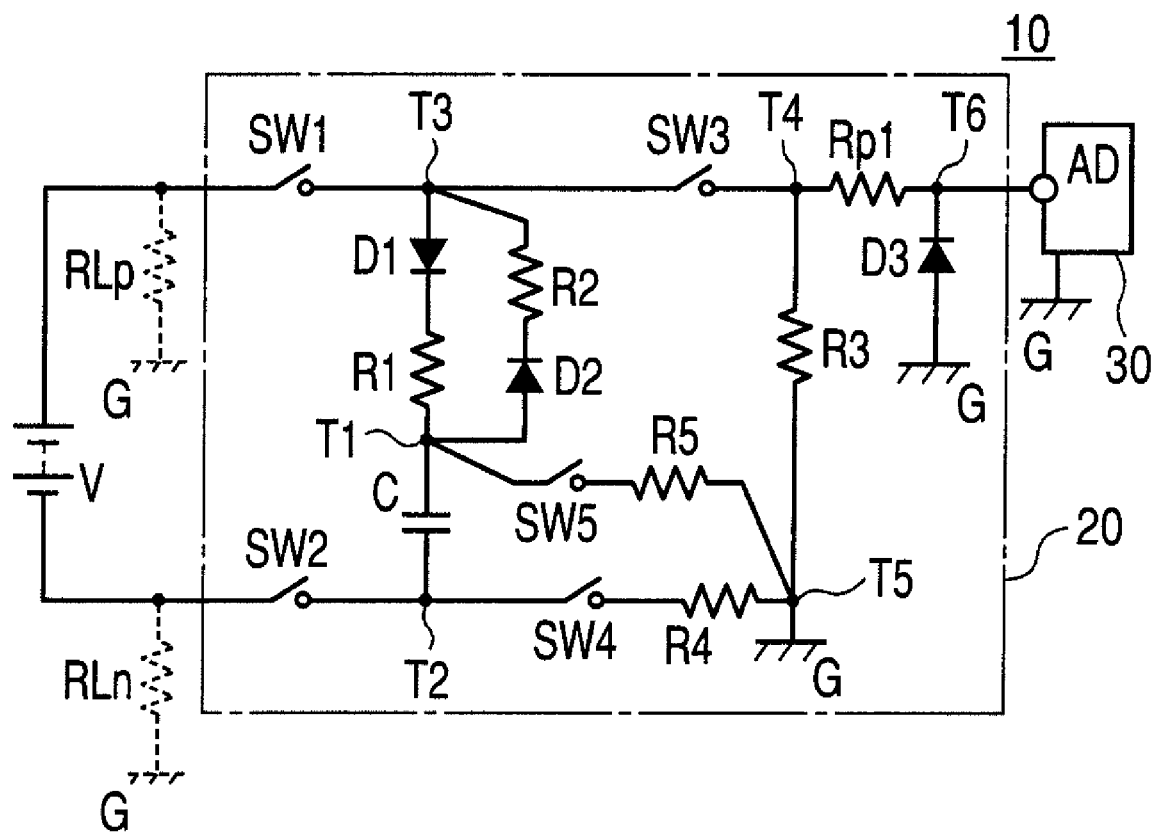
FIG. 1 is a diagram showing an insulation measurement circuit according to the basic technique of an embodiment.

FIG. 1 is a circuit diagram showing the configuration of an insulation measurement circuit 10 according to the embodiment. As shown in the figure, the insulation measurement circuit 10 includes a detection circuit 20 and a determination control portion 30. The insulation state of a power supply V is detected by checking the insulation state of the high-voltage power supply V coupled to the detection circuit 20. In this embodiment, the detection is made as to the insulation state of a positive electrode side grounding resistor RLp as the insulation resistor on the positive electrode side of the power supply V and the insulation state of a negative electrode side grounding resistor RLn as the insulation resistor on the negative electrode side. When it is not necessary to distinguish between the positive electrode side grounding resistor RLp and the negative electrode side grounding resistor RLn, each of these resistors is merely referred to as the "grounding resistor RL".

In an automobile etc., the insulation state with respect to the power supply V deteriorates gradually in some cases. For example, the resistance value of the grounding resistor RL serving as an index of the insulation state reduces gradually from a certain value representing the good insulation state and reaches a threshold value RLx (hereinafter called an "alarm threshold value RLx") representing that the insulation state has deteriorated and so a predetermined alarm is to be issued. When the insulation state further deteriorates, the resistance value reaches a certain value representing the insulation failure. According to the insulation measurement circuit 10 of the embodiment, when the circuit 30 detects that the value of the grounding resistor RL reaches the alarm threshold value RLx, it is notified by an alarm lamp etc. that the insulation deterioration occurs.

The determination control portion 30 is provided with an input port AD, and has a voltage measurement function of subjecting the voltages (values corresponding to $VC1p$, $VC1n$, $V0$ described later) inputted into the input port AD to an A/D conversion processing and measuring the voltages thus converted and a function of controlling the on/off operations of first to fifth switches SW1 to SW5 provided in the detection circuit 20 explained later. Further, the determination control portion 30 subjects the voltages (the values corresponding to $VC1p$, $VC1n$, $V0$) inputted into the input port AD to an insulation resistor conversion by using a calculation expression $(VC1p+VC1n)/V0$. The insulation resistor conversion will be explained later. The determination control portion 30 has a predetermined table for storing the values of the grounding resistor RL (insulation resistance values) relative to the calculation expression $(VC1p+VC1n)/V0$. The determination control portion determines the insulation state with reference to the table and determines that the insulation state is deteriorated when the value of the grounding resistor RL thus obtained is equal to or less than the alarm threshold value RLx.

The detection circuit 20 is arranged in a manner that the first switch SW1, a first diode D1, a first resistor R1, a capacitor C and the second switch SW2 are coupled in series sequentially from the positive electrode side to the negative electrode side of the power supply V. In the following explanation, the values of the resistors are shown by the same symbols as those of the resistors, respectively (for example, the resistance value of the first resistor R1 is also shown by "R1"). A terminal (a terminal coupled to the first resistor R1) on the positive electrode side of the capacitor C is called a first terminal point T1 for descriptive purposes. Similarly, a terminal (a terminal coupled to the second switch SW2) on the negative electrode side of the capacitor C is called a second terminal point T2. Further, a coupling point (a portion on the anode side of the first diode D1) between the first switch SW1 and the first diode D1 is called a third terminal point T3. The forward direction of the first diode D1 coincides with a direction directed to the first terminal R1 (the first terminal point T1) from the first switch SW1 (the third terminal point T3).

A series connection of a second diode D2 and a second resistor R2 is coupled from the terminal (the first terminal point T1) on the positive electrode side of the capacitor C to the anode (the third terminal point T3) of the first diode D1. To be more concrete, the anode of the second diode D2 is coupled to the first terminal point T1 and the cathode of the second diode D2 is coupled to one terminal of the second resistor R2.

Further, the other terminal of the second resistor R2 is coupled to the anode (the third terminal point T3) of the first diode D1.

Further, a series connection of the third switch SW3, a third resistor R3, a fourth resistor R4 and the fourth switch SW4 sequentially provided from the third terminal point T3 to the second terminal point T2 is coupled in parallel to the path including the capacitor C.

Further, a fourth terminal point T4 on the way of a path formed between the third switch SW3 and the third resistor R3 is coupled to the input port AD via a protection resistor Rp1. The cathode of a third diode D3 is coupled to a sixth terminal point T6 on the way of a path between the protection resistor Rp1 and the input port AD, and the anode of the third diode D3 is grounded.

Further, a fifth terminal point T5 on the way of a path formed between the third resistor R3 and the fourth resistor R4 is coupled to the ground potential G. The resistance value of the third resistor R3 is set to be same as that of the fourth resistor R4

Further, a series connection of the fifth switch SW5 and a fifth resistor R5 is coupled from the terminal (the first terminal point T1) on the positive electrode side of the capacitor C to the ground potential G of the second terminal point T2.

The explanation will be made as to the determination procedure of the insulation state of the power supply V according to the above configuration. FIG. 2 is a diagram showing a schematic flow (hereinafter called "a basic method") of respective modes in the basic technique. Although the details of the respective modes is explained later, the basic technique is roughly configured by four modes, that is, 1) a power supply charge voltage measurement mode (hereinafter called "a V0 measurement mode"), 2) a negative electrode side grounding resistor measuring voltage measurement mode (hereinafter called "a VC1$n$ measurement mode"), 3) a positive electrode side grounding resistor measuring voltage measurement mode (hereinafter called "a VC1$p$ measurement mode"), and 4) an insulation resistor conversion mode (hereinafter called "a determination mode"). In the basic technique, the processing is executed in the order of 1) to 4).

Next, the explanation will be made as to the operation of the insulation measurement circuit 10 in the respective modes.

1) V0 Measurement Mode

Figure 3A:
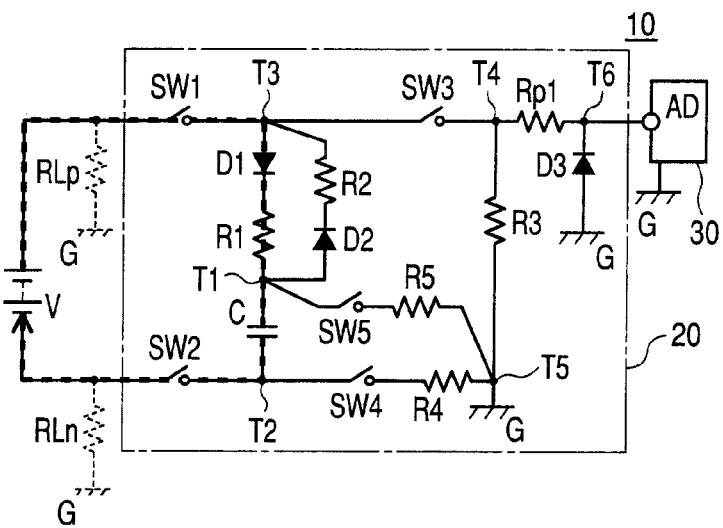
FIGS. 3A to 3C are closed circuit diagrams formed at the time of a power supply charge voltage measurement mode according to the embodiment.
Figure 3B:
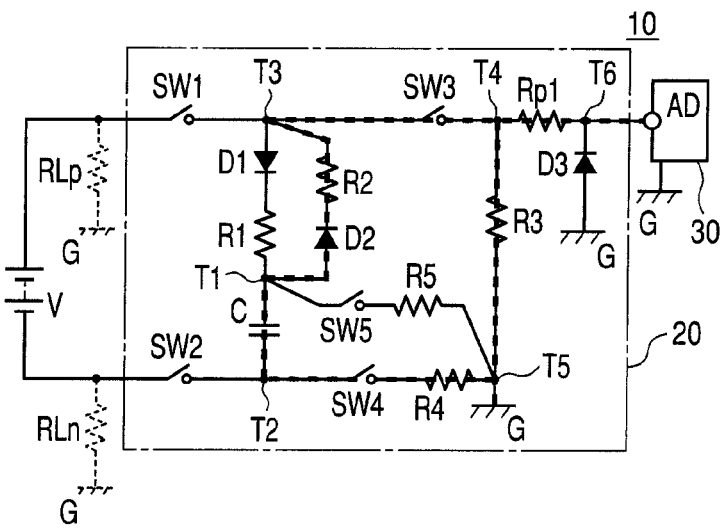
Figure 3C:
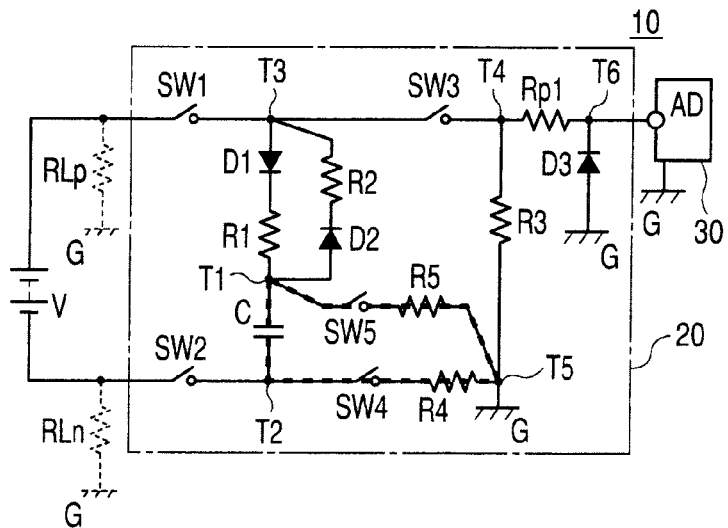

FIGS. 3A to 3C shows closed circuit diagrams formed at the time of the V0 measurement mode. As shown by a thick broken line in FIG. 3A, the determination control portion 30 turns the first and second switches SW1, SW2 on to form a path formed by the first switch SW1, the first diode D1, the first resistor R1, the capacitor C and the second switch SW2 from the positive electrode side to the negative electrode side of the power supply V to thereby set the voltage (this voltage is called "a high voltage V0") of the power supply V to the capacitor C ("V0 charge" in FIG. 2). The power supply charge voltage V0 is set in correspondence to a turn-on time period (charge time period).

Then, as shown in FIG. 3B, the determination control portion 30 turns the first and second switches SW1, SW2 off and turns the third and fourth switches SW3, SW4 on, whereby the input port AD measures the power supply high voltage V0 set to the capacitor C ("V0 measurement" in FIG. 2). To be concrete, since the third and fourth switches SW3, SW4 are turned on, a closed circuit is configured by the capacitor C, the second diode D2, the second resistor R2, the third switch SW3, the third resistor R3, the fourth resistor R4 and the fourth switch SW4. Then, a voltage divided by the second resistor R2, the third resistor R3 and the fourth resistor R4 is inputted as a voltage of V0×R3/(R2+R3+R4) into the determination control portion 30 (the input port AD) via the protection resistor Rp1 and measured thereby.

When the measurement is completed, as shown in FIG. 3C, the determination control portion 30 turns only the fourth switch SW4 and the fifth switch SW5 on to thereby discharge the electric charge of the capacitor C via the fifth resistor R5 ("discharge" in FIG. 2).

2) VC1$n$ Measurement Mode

Figure 4:
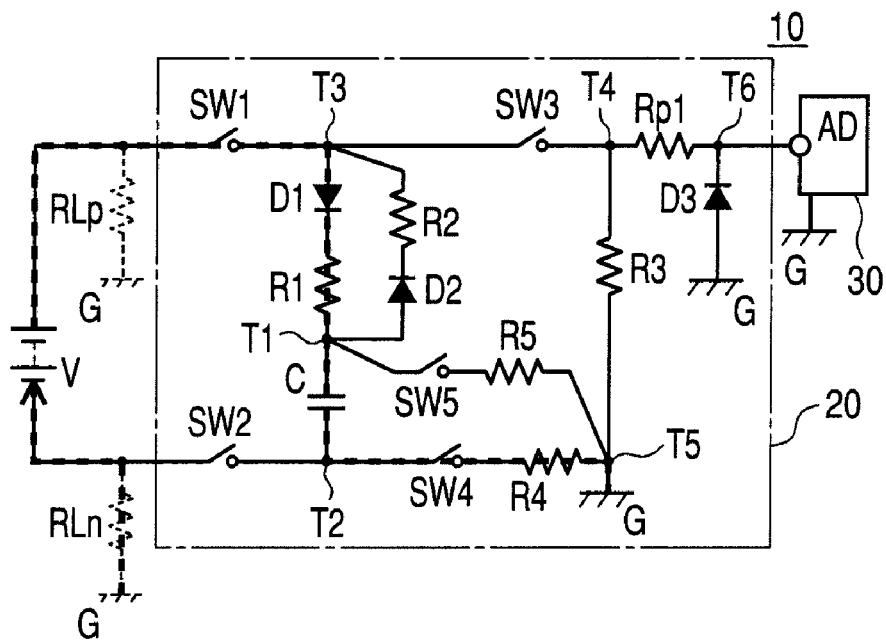
FIG. 4 is a closed circuit diagram formed at the time of a negative electrode side grounding resistor measuring voltage measurement mode according to the embodiment.

In the VC1$n$ measurement mode, as shown by a thick broken line in FIG. 4, the determination control portion 30 turns the third and fourth switches SW3, SW4 on for a predetermined time period to set a voltage caused by the negative electrode side grounding resistor RLn (hereinafter called "a negative electrode side grounding resistor measurement voltage VC1$n$") to the capacitor C as a voltage corresponding to the turn-on time period (charge time period) ("VC1$n$ charge" in FIG. 2). In this case, a closed circuit is formed in the order from the ground potential G, the negative electrode side grounding resistor RLn, the power supply V, the first switch SW1, the first diode D1, the first resistor R1, the capacitor C, the fourth switch SW4, the fourth resistor R4 to the ground potential G.

Then, the determination control portion 30 turns the first switch SW1 off and turns the third switch SW3 on to thereby form the closed circuit same as that of FIG. 2B, whereby the input port AD measures a divided voltage of the negative electrode side grounding resistor measurement voltage VC1$n$ set to the capacitor C ("VC1$n$ measurement" in FIG. 2). To be concrete, like the V0 measurement mode, a closed circuit is formed by the capacitor C, the second diode D2, the second resistor R2, the third switch SW3, the third resistor R3, the fourth resistor R4 and the fourth switch SW4. Then, a voltage divided by the second resistor R2, the third resistor R3 and the fourth resistor R4 is inputted as a voltage of VC1$n$×R3/(R2+R3+R4) into the determination control portion 30 (the input port AD) via the protection resistor Rp1 and measured thereby.

When the measurement is completed, the determination control portion 30 turns only the fourth switch SW4 and the fifth switch SW5 on to constitute the closed circuit same as that of FIG. 2B to thereby discharge the electric charge of the capacitor C via the fifth resistor R5 ("discharge" in FIG. 2).

3) VC1$p$ Measurement Mode

Figure 5:
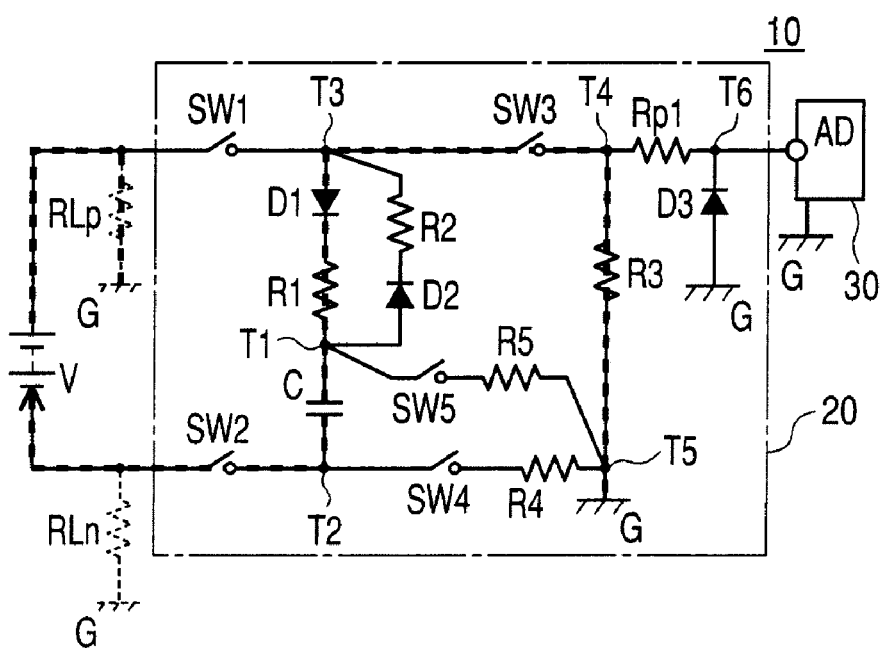
FIG. 5 is a closed circuit diagram formed at the time of a positive electrode side grounding resistor measuring voltage measurement mode according to the embodiment.

In the VC1$n$ measurement mode, as shown by a thick broken line in FIG. 5, the determination control portion 30 turns the second and third switches SW2, SW3 on to set a voltage caused by the positive electrode side grounding resistor RLp (hereinafter called "a positive electrode side grounding resistor measurement voltage VC1$p$") to the capacitor C ("VC1$p$ charge" in FIG. 2). In this case, a closed circuit is formed in the order from the ground potential G, the third resistor R3, the third switch SW3, the first diode D1, the first resistor R1, the capacitor C, the second switch SW2, the power supply V, the positive electrode side grounding resistor RLp to the ground potential G.

Then, the determination control portion 30 turns the second switch SW2 off and turns the fourth switch SW4 on, whereby the input port AD measures the positive electrode side grounding resistor measurement voltage VC1$p$ set to the capacitor C ("VC1$p$ measurement" in FIG. 2). To be concrete, like the V0 measurement mode, a closed circuit is formed by the capacitor C, the second diode D2, the second resistor R2, the third switch SW3, the third resistor R3, the fourth resistor R4 and the fourth switch SW4. Then, a voltage divided by the second resistor R2, the third resistor R3 and the fourth resistor R4 is inputted as a voltage of VC1$p$×R3/(R2+R3+R4) into the determination control portion 30 (the input port AD) via the protection resistor Rp1 and measured thereby.

When the measurement is completed, the determination control portion 30 turns only the fourth switch SW4 and the fifth switch SW5 on to thereby discharge the electric charge of the capacitor C to the ground potential G via the fifth resistor R5 ("discharge" in FIG. 2).

In each of the V0 measurement mode, the VC1$n$ measurement mode and the VC1$p$ measurement mode, as described above, the determination control portion 30 measures the voltage divided by the second resistor R2, the third resistor R3 and the fourth resistor R4 and the voltage dividing ratios of the respective modes are same. Thus, V0, VC1$p$ and VC1$n$ of expressions explained below are treated as the same values as those of the divide voltages. Further, when it is not necessary to distinguish between the positive electrode side grounding resistor measurement voltage VC1$p$ and the negative electrode side grounding resistor measurement voltage VC1$n$, each of these voltages is merely called the "grounding resistor measurement voltage VC1".

4) Insulation Resistor Conversion Mode (Determination Mode)

In the insulation resistor conversion mode, the determination control portion 30 performs the insulation resistor conversion based on the following expression (1) in accordance with the aforesaid measurement result.

$$\text{Insulation resistor conversion} = (VC1p + VC1n)/V0 \qquad (1)$$

For example, when the insulation property of the one electrode degrades, that is, when the insulation property of the positive electrode side grounding resistor RLp or the negative electrode side grounding resistor RLn degrades and the resistance value reaches the alarm threshold value RLx, the grounding resistor measurement voltage VC1 (VC1$p$ or VC1$n$) of the electrode on the insulation side becomes high. In this case, it is supposed that the insulation property of the positive electrode side grounding resistor RLp is degraded, the insulation property of the negative electrode side grounding resistor RLn is good (the insulation resistance value is infinite) and VC1$p$ is zero. Thus, the insulation resistor conversion can be expressed by the following expression (2).

$$\text{Insulation resistor conversion} = (VC1p + VC1n)/V0 = VC1n/V0 \qquad (2)$$

The capacitor C formed by the ceramic capacitor has the DC bias characteristics that the capacitance value thereof reduces in accordance with the increase of the applied voltage. Supposing that coefficients relating to the influence of the characteristics are $\alpha$ (corresponding to VC1$n$) and $\alpha''$ (corresponding to V0) and a coefficient relating to the influence of the variance of a peripheral circuit is $\beta$, the conversion expression of the expression (2) can be expressed by the following expression (3) and so the influence of the DC bias characteristics remains.

$$\text{Insulation resistor conversion} = VC1n \times \alpha' \times \beta / (V0 \times \alpha \times \beta) \qquad (3)$$
$$= VC1n \times \alpha' / (V0 \times \alpha)$$

When the resistance value reaches the alarm threshold value RLx, in order to coincide these two coefficients $\alpha$ and $\alpha'$ to each other, the grounding resistor measurement voltage VC1 (VC1$p$ or VC1$n$) set to the capacitor C and the power supply high voltage V0 are made coincide to each other. Thus, the DC bias characteristics shown by the coefficients $\alpha$ and $\alpha'$ are made coincide, whereby the aforesaid influence is eliminated.

In the aforesaid insulation resistor conversion, a desired detection accuracy is realized on the assumption that the voltage of the power supply V is constant. However, in the case where the V0 measurement mode for measuring the power supply charge voltage V0 set to the capacitor is terminated and the mode shifts to the VC1$n$ measurement mode or the VC1$p$ measurement mode for measuring the grounding resistor measurement voltage VC1, if the power supply charge voltage V0 fluctuates, the insulation resistor conversion to be obtained originally may changes and so the detection accuracy may degrade. That is, since the grounding resistor measurement voltage VC1 is set in accordance with the voltage of the power supply V, when the voltage of the power supply V changes, the grounding resistor measurement voltage VC1 changes and so deviates. Thus, the voltage of the power supply V at the time of setting the power supply charge voltage V0 used for the insulation resistor conversion of the expression (2) differs from the voltage of the power supply V at the time of setting the grounding resistor measurement voltage VC1. As a result, there may arise a case that the insulation property is determined good despite that the grounding resistor RL reaches the alarm threshold value RLx and so the insulation property is degraded, or that the insulation property is degraded despite that the insulation property is good. When the fluctuation degree of the voltage of the power supply V is small, it was practically allowed conventionally. However, since in recent years the measurement of a higher accuracy is desired and electric power is supplied to more electrical equipments it has become further necessary to take the fluctuation of the voltage of the power supply V into consideration.

Accordingly, as explained below, the measurement of the power supply charge voltage V0 is realized with a higher accuracy by the measurement process obtained by improving the basic method. The explanation will be made as to three kinds of measurement methods, that is, first to third measurement methods as shown in FIG. 6A to 6C.

<First Measurement Method>

In the basic method shown in FIG. 2, the V0 measurement mode, the VC1$n$ measurement modes the VC1$p$ measurement mode and the determination mode are executed in this order. However, according to this first measurement method, as shown in FIG. 6A, the V0 measurement mode is executed again before starting the VC1$p$ measurement mode after the completion of the VC1$p$ measurement mode. A charge time period TC1 of the capacitor C in the V0 measurement mode is set to a time period insufficient for the full charge.

In this manner, the five kinds of modes, that is, the first V0 measurement mode, the VC1$n$ measurement mode, the second V0 measurement mode, the VC1$p$ measurement mode and the determination mode are executed in this order. Supposing that the power supply charge voltage measured in the first V0 measurement mode is V01 and the power supply charge voltage measured in the second V0 measurement mode is V02, the insulation resistor conversion is performed based on the following expression (4).

$$\text{Insulation resistor conversion} = VC1n/V01 + VC1p/V02 \qquad (4)$$

There may arise a case that the measurement value of the positive electrode side grounding resistor measurement voltage VC1$p$ contains the influence of the negative electrode side grounding resistor measurement voltage VC1$n$ and the measurement value of the negative electrode side grounding resistor measurement voltage VC1$n$ contains the influence of the positive electrode side grounding resistor measurement voltage VC1p. Thus, the insulation resistor conversion is performed based on the following expression (5) in which an average value of V01 and V02 is used in place of V0 in the expression (1).

Insulation resistor conversion=$(VC1p+VC1n)/\{(V01+V02)/2\}$ (5)

Since the operation other than the aforesaid operation of the insulation measurement circuit 10 is same in each of the respective measurement modes, the explanation thereof will be omitted.

In this manner, since the measurement timings of the power supply charge voltage V0 and the negative electrode side grounding resistor measurement voltage VC1n are made coincide with the measurement timings of the power supply charge voltage V0 and the positive electrode side grounding resistor measurement voltage VC1p, even if the voltage of the power supply V changes, the influence of the change can be reduced. For example, in the case where the voltage of the power supply V reduces or increases uniformly, the deviation of the positive electrode side grounding resistor measurement voltage VC1p being measured at the later measurement timing in FIG. 2 becomes larger. However, according to the first measurement method, the deviations of the voltage from the voltage at the measurement timing of the power supply charge voltage V0 can be made same in each of the measurement timings of the negative electrode side grounding resistor measurement voltage VC1n and the positive electrode side grounding resistor measurement voltage VC1p, the influence of the voltage fluctuation of the power supply V can be reduced. As a result, the measurement accuracy of the insulation measurement circuit 10 can be improved.

Further, each of the power supply charge voltages V01 and V02 respectively measured by the first and second V0 measurement modes may be weighted and subjected to the averaging processing as shown by the following expression (6).

$V0=(V01\times a+V02\times b)/2$ ($a$, $b$: weighting coefficients) (6)

For example, in the case where the voltage V changes with a constant tendency, when the tendency is reflected on the measurement voltages by the weighting coefficients a and b as shown by the expression (6), the averaging processing more accorded to the actual state can be performed and so the detection accuracy can be improved furthermore.

Further, when the averaging processing shown by the following expression (7) is performed by using a voltage V03 before or after the measurement timing, the detection accuracy can be further improved.

$V0=(V01\times a+V02\times b+V03\times c)/3$ ($a$, $b$, $c$: weighting coefficients) (7)

<Second Measurement Method>

In the second measurement method, as shown in FIG. 6B, the charge time period TC1 of the power supply charge voltage V0 (V01, V02) in the first and second V0 measurement modes of the first measurement method is set to a charge time period TC2 capable of fully charging. Since the other conditions of the first and second V0 measurement modes and the operations in the VC1n measurement mode, the second V0 measurement mode, the VC1p measurement mode and the determination mode are same, the explanation thereof will be omitted.

In the second measurement method, since the power supply charge voltage V0 is placed in a fully charged state, the influence of the DC bias characteristics of the capacitor C formed by the ceramic capacitor can be removed. For example, in such a circumference that a high voltage measurement device (not shown) monitoring the voltage of the power supply V becomes failure, when it is required to grasp the power supply V in preference to the measurement accuracy of the insulation measurement circuit 10, the apparatus is acted as the backup device of the high-voltage measurement device since the measurement accuracy of the voltage V0 is improved according to this method.

<Third Measurement Methods>

In the third measurement method, as shown in FIG. 6C, the charge time period TC1 of the power supply charge voltage V0 (V01) in the first V0 measurement mode of the first measurement method is set to the charge time period TC2 capable of fully charging. Further, the charge time period of the power supply charge voltage V0 (V02) in the second V0 measurement mode is not changed and set to the predetermined charge time period TC1 insufficient for the full charge like the first measurement method. Since the other conditions of the first and second V0 measurement modes and the operations in the VC1n measurement mode, the second V0 measurement mode, the VC1n measurement mode, the second V0 measurement mode, VC1p measurement mode and the determination mode are same, the explanation thereof will be omitted.

Then, the determination control portion 30 notifies, to a predetermined device, the measurement result of the first V0 measurement mode of the charge time period TC2 of the full charge as an alternative measurement voltage value in place of the voltage measured by the high-voltage measurement device. Further, the measurement result of the second V0 measurement mode measured during the charge time period TC1 insufficient for the full charge is used for the insulation resistor conversion of the expression (1).

According to the third measurement method, since the usage of the measurement result is determined in accordance with the measurement timing of the power supply charge voltage V0, in the case of the failure of the high-voltage measurement device, the apparatus can be acted as the backup device of the high-voltage measurement device and can realize the monitoring of the grounding resistor RL (the insulation measurement circuit 10) with a desired detection accuracy.

The invention is explained above based on the embodiments. However, these embodiments are mere examples and it will be understood for those skilled in the art that various modifications may be made in the respective constituent elements an the combination thereof and such the modifications are within the range of the invention.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2008-137060 filed on May 26, 2008, the contents of which are incorporated herein for reference.

What is claimed is:

1. An insulation measurement method in an insulation measurement apparatus of a flying capacitor type, the insulation measurement method comprising:
   a first power supply charge voltage measurement step of applying a voltage of a power supply to a flying capacitor for a first charge time period;
   a first grounding resistor measuring voltage measurement step of applying the voltage of the power supply to the flying capacitor via an insulation resistor on one electrode side of the power supply;

a second power supply charge voltage measurement step of applying the voltage of the power supply to the flying capacitor for a second charge time period;

a second grounding resistor measuring voltage measurement step of applying the voltage of the power supply to the flying capacitor via an insulation resistor on the other electrode side of the power supply; and an insulation resistor conversion step of obtaining a value of the insulation resistor based on measurement results of the first and second charge voltage measurement steps and the first and second grounding resistor measuring voltage measurement steps and an insulation resistor conversion expression, wherein in a first measuring process conducted in a state that a voltage measurement device for measuring the voltage of the power supply is normal, the charge time period of each of the first and second power supply charge voltage measurement steps and the first and second grounding resistor measuring voltage measurement steps is set to be a time period insufficient for fully charging the flying capacitor, and wherein in a second measuring process conducted in a state that the voltage measurement device for measuring the voltage of the power supply is not normal, the charge time period of each of the first and second grounding resistor measuring voltage measurement steps is set to be a time period insufficient for fully charging the flying capacitor and each of the first charge time period and the second charge time period is set to be a time period for fully charging the flying capacitor, and a measurement result of the voltage of the power supply measured in the first power supply charge voltage measurement step or the second power supply charge voltage measurement step is notified to a predetermined device to be originally notified from the voltage measurement device, instead of the voltage measurement device.

2. An insulation measurement method in an insulation measurement apparatus of a flying capacitor type, the method comprising:

a first power supply charge voltage measurement step of applying a voltage of a power supply to a flying capacitor for a first charge time period;

a first grounding resistor measuring voltage measurement step of applying the voltage of the power supply to the flying capacitor via an insulation resistor on one electrode side of the power supply;

a second power supply charge voltage measurement step of applying the voltage of the power supply to the flying capacitor for a second charge time period;

a second grounding resistor measuring voltage measurement step of applying the voltage of the power supply to the flying capacitor via an insulation resistor on the other electrode side of the power supply; and an insulation resistor conversion step of obtaining a value of the insulation resistor based on measurement results of the first and second charge voltage measurement steps and the first and second grounding resistor measuring voltage measurement steps and an insulation resistor conversion expression, wherein, in a first measuring process conducted in a state that a voltage measurement device for measuring the voltage of the power supply is normal, the charge time period of each of the first and second power supply charge voltage measurement steps and the first and second grounding resistor measuring voltage measurement steps is set to be a time period insufficient for fully charging the flying capacitor, and wherein, in a second measuring process conducted in a state that the voltage measurement device for measuring the voltage of the power supply is not normal, the first charge time period of the first power supply charge voltage measurement step is set to be a time period for fully charging the flying capacitor and the second charge time period of the second power supply charge voltage measurement step is set to be a time period insufficient for fully charging the flying capacitor, a measurement result of the voltage of the power supply measured in the first power supply charge voltage measurement step is notified to a predetermined device to be originally notified from the voltage measurement device, instead of the voltage measurement device, and a measurement result of the voltage of the power supply measured in the second power supply charge voltage measurement step is used in the insulation resistor conversion step.

3. An insulation measurement apparatus for executing an insulation measurement method, the apparatus comprising a controller configured to:

perform a first power supply charge voltage measurement step of applying a voltage of a power supply to a flying capacitor for a first charge time period;

perform a first grounding resistor measuring voltage measurement step of applying the voltage of the power supply to the flying capacitor via an insulation resistor on one electrode side of the power supply;

perform a second power supply charge voltage measurement step of applying the voltage of the power supply to the flying capacitor for a second charge time period;

perform a second grounding resistor measuring voltage measurement step of applying the voltage of the power supply to the flying capacitor via an insulation resistor on the other electrode side of the power supply; and perform an insulation resistor conversion step of obtaining a value of the insulation resistor based on measurement results of the first and second charge voltage measurement steps and the first and second grounding resistor measuring voltage measurement steps and an insulation resistor conversion expression, wherein in a first measuring process conducted in a state that a voltage measurement device for measuring the voltage of the power supply is normal, the charge time period of each of the first and second power supply charge voltage measurement steps and the first and second grounding resistor measuring voltage measurement steps is set to be a time period insufficient for fully charging the flying capacitor, and wherein in a second measuring process conducted in a state that the voltage measurement device for measuring the voltage of the power supply is not normal, the charge time period of each of the first and second grounding resistor measuring voltage measurement steps is set to be a time period insufficient for fully charging the flying capacitor and each of the first charge time period and the second charge time period is set to be a time period for fully charging the flying capacitor, and a measurement result of the voltage of the power supply measured in the first power supply charge voltage measurement step or the second power supply charge voltage measurement step is notified to a predetermined device to be originally notified from the voltage measurement device, instead of the voltage measurement device.

4. An insulation measurement apparatus for executing an insulation measurement method, the apparatus comprising a controller configured to:

perform a first power supply charge voltage measurement step of applying a voltage of a power supply to a flying capacitor for a first charge time period;

perform a first grounding resistor measuring voltage measurement step of applying the voltage of the power supply to the flying capacitor via an insulation resistor on one electrode side of the power supply;

perform a second power supply charge voltage measurement step of applying the voltage of the power supply to the flying capacitor for a second charge time period;

perform a second grounding resistor measuring voltage measurement step of applying the voltage of the power supply to the flying capacitor via an insulation resistor on the other electrode side of the power supply; and perform an insulation resistor conversion step of obtaining a value of the insulation resistor based on measurement results of the first and second charge voltage measurement steps and the first and second grounding resistor measuring voltage measurement steps and an insulation resistor conversion expression, wherein, in a first measuring process conducted in a state that a voltage measurement device for measuring the voltage of the power supply is normal, the charge time period of each of the first and second power supply charge voltage measurement steps and the first and second grounding resistor measuring voltage measurement steps is set to be a time period insufficient for fully charging the flying capacitor, and wherein, in a second measuring process conducted in a state that the voltage measurement device for measuring the voltage of the power supply is not normal, the first charge time period of the first power supply charge voltage measurement step is set to be a time period for fully charging the flying capacitor and the second charge time period of the second power supply charge voltage measurement step is set to be a time period insufficient for fully charging the flying capacitor, a measurement result of the voltage of the power supply measured in the first power supply charge voltage measurement step is notified to a predetermined device to be originally notified from the voltage measurement device, instead of the voltage measurement device, and a measurement result of the voltage of the power supply measured in the second power supply charge voltage measurement step is used in the insulation resistor conversion step.

* * * * *